United States Patent [19]
Wilson

[11] 4,363,928
[45] Dec. 14, 1982

[54] THERMOELECTRIC GENERATOR PANEL AND COOLING DEVICE THEREFOR

[76] Inventor: Kenneth T. Wilson, P.O. Box 267, Ocala, Fla. 32670

[21] Appl. No.: 275,754

[22] Filed: Jun. 22, 1981

Related U.S. Application Data

[63] Continuation-in-part of Ser. No. 117,342, Feb. 15, 1980, Pat. No. 4,276,441.

[51] Int. Cl.³ .................. H01L 35/00; H01L 35/28
[52] U.S. Cl. ............................ 136/206; 29/573; 136/210; 136/212; 136/225; 136/227; 136/236 R; 136/241
[58] Field of Search ............... 29/573; 136/206, 209, 136/210, 211, 212, 225, 227, 236 R, 241

[56] References Cited
U.S. PATENT DOCUMENTS

| | | | |
|---|---|---|---|
| 3,071,495 | 1/1963 | Hanlein | 136/212 |
| 3,284,245 | 11/1966 | Nottage et al. | 136/212 |
| 3,981,751 | 9/1976 | Dashevsky et al. | 136/212 |
| 4,004,948 | 1/1977 | Smith | 136/241 |
| 4,098,617 | 7/1978 | Lidorenko et al. | 136/225 |
| 4,111,717 | 9/1978 | Baxter | 136/225 |
| 4,125,122 | 11/1978 | Stachurski | 136/210 |

Primary Examiner—Leland A. Sebastian
Attorney, Agent, or Firm—Alfred E. Wilson

[57] ABSTRACT

A thermoelectric generator panel and heat exchanger is disclosed. The heat exchanger, in a preferred form, is comprised of a water compartment or chamber, fixed relative to the normally cool side of a solar panel, comprised of a substantial plurality of substrate strips, each strip carrying a plurality of thermocouples, printed in series, and in metallic inks, along one side of the respective strips. Terminal tabs are provided on opposed ends of each strip of thermocouples which are electrically interconnected, in parallel, and a voltage regulator, connected between the panel strips and a pump, serves to energize the pump when the voltage reaches a predetermined voltage level, to circulate water from any suitable source, such as ground water, through the water chamber to enhance the cooling of the normally cool side of the thermocouple panel.

8 Claims, 7 Drawing Figures

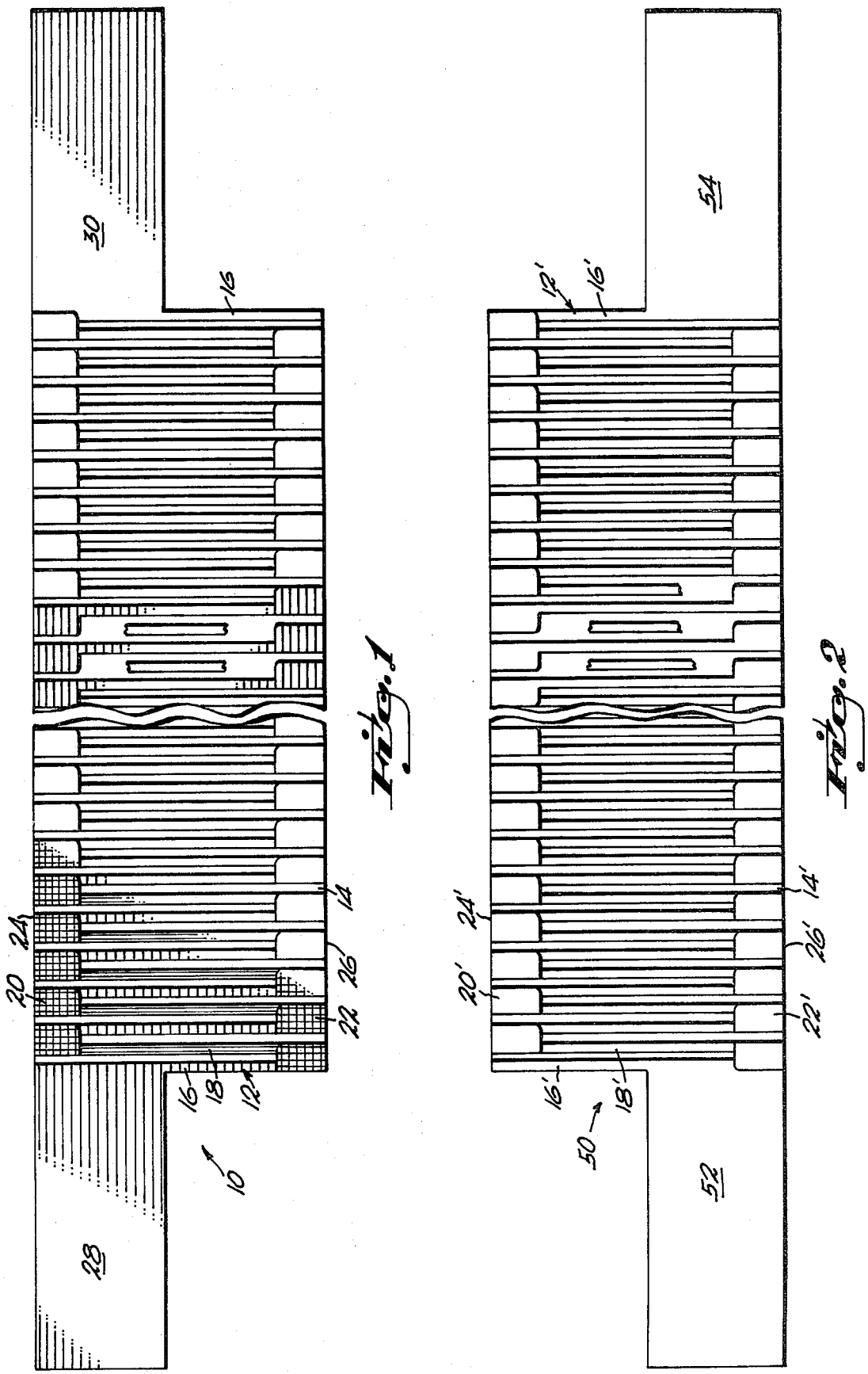

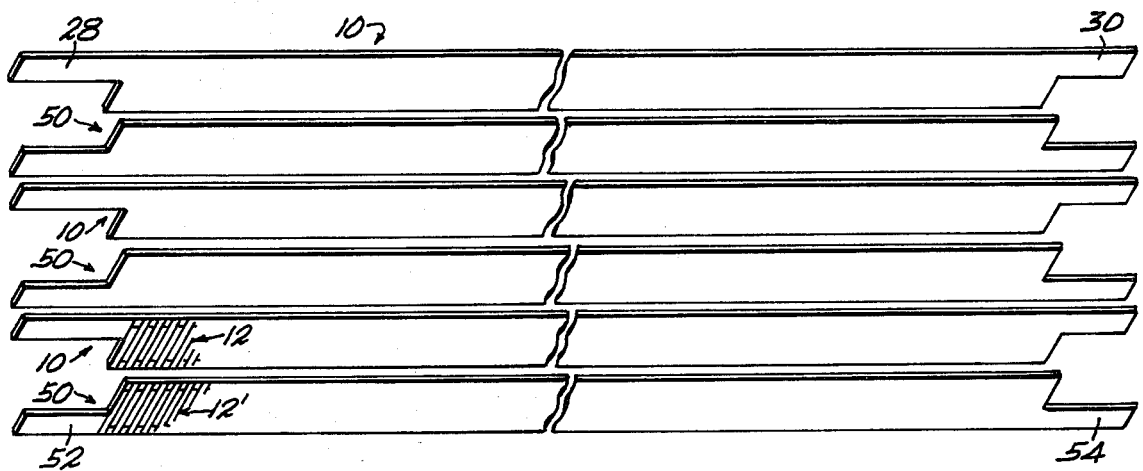
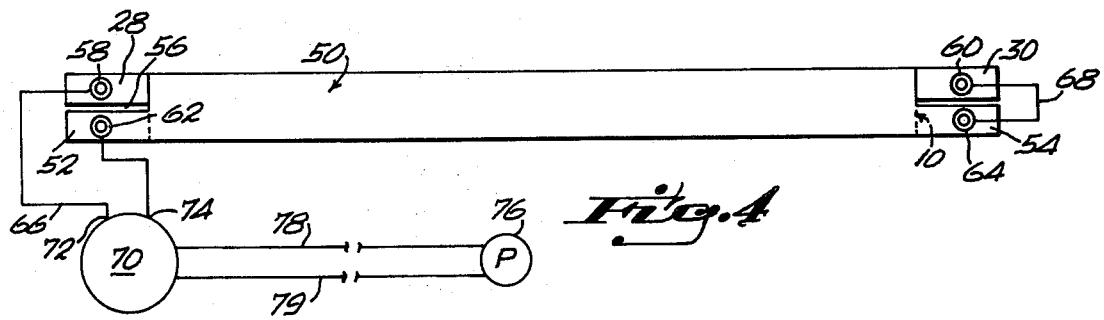
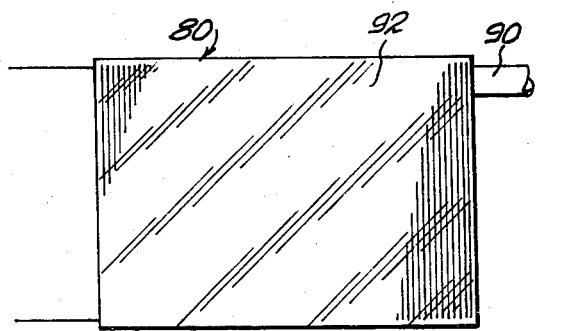
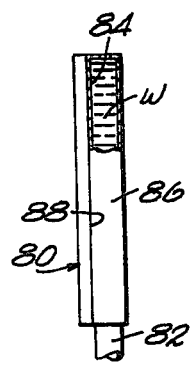
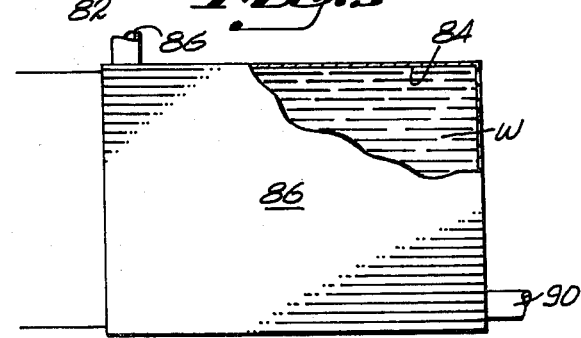

THERMOELECTRIC GENERATOR PANEL AND COOLING DEVICE THEREFOR

This is a continuation-in-part of my copending application Ser. No. 117,342 filed Feb. 15, 1980 now U.S. Pat. No. 4,276,441.

BACKGROUND OF THE PRESENT INVENTION

The present invention pertains to a thermoelectric generator, and more particularly to a thermoelectric generator comprised of a plurality of thermocouples, printed in series in metallic inks, respectively or otherwise formed along the length of each of a plurality of substrate strips, which are disposed in a face-to-back relation, and are connected in parallel to define a panel. A first, normally hot side of the panel is glazed with a suitable sealant, such as Dow-Corning Silicone material.

A second or cool side of the panel is provided with a water chamber, sized to substantially cover the second, normally cool side of the panel. A control device, such as a voltage regulator, is electrically connected to the thermocouple strips and when the voltage reaches a predetermined level, the control device energizes a pump to circulate water, from any suitable source, through the water chamber to enhance the cooling of the normally cool side of the panel to produce a maximum amount of electrical energy.

Therefore, the principal object of the invention is to provide a heat exchanger, fixed to the normally cool side of a thermoelectric generator panel, to enhance the cooling thereof to produce a maximum amount of electrical energy therefrom.

BRIEF DESCRIPTION OF THE DRAWINGS

FIG. 1 is a fragmentary, enlarged elevational view of a first thermocouple strip of the automatically cooled thermoelectric generator panel of the present invention;

FIG. 2 is a similar elevational view of a second thermocouple strip;

FIG. 3 is an isometric view of a plurality of alternating first and second strips in an exploded relation;

FIG. 4 is an end elevational view of a plurality of alternating first and second strips, electrically interconnected, and including a voltage regulator, electrically connected between a water pump and the alternating strips;

FIG. 5 is a face view of a first side of a panel, formed by an alternating face-to-back plurality of the first and second strips;

FIG. 6 is a face view of a second side of the panel of FIG. 5, partially in cross section; and FIG. 7 is an end view of FIGS. 5 and 6, partially in cross section.

DESCRIPTION OF A PREFERRED FORM OF THE INVENTION

With reference to the drawings, and particularly to FIG. 1, a thermocouple generator strip, indicated generally at 10, includes a plurality of thermocouples 12, disposed in series along an appropriate substrate strip 14, generally defining a pulsed square wave form. The thermocouples are formed of vertically spaced apart legs such as 16 and 18 with oppositely projecting top and bottom couples 20, 22 connecting between pairs of legs 16, 18 in a manner so as to produce the pulsed wave form. The thermocouple design 12 is printed on the substrate strips, utilizing a first particulated metal, such as copper, mixed with a suitable binder or flux, and printed on the substrate to define the first legs 16, and a second particulated metal, such as constantan is printed on the strip 14 to define the second legs 18 and the couples 20, 22. The couples 20 define the normally hot edge 24, and couples 22, the normally cool edge 26. The strip 14 is then subjected to a suitable heat source to melt the particulated metals into solid masses, causing an intermingling of the overlying constantan and copper in the couples 20 and 22.

A pair of terminal tabs 28, 30 coated with the first metal, such as copper, electrically connects to end first legs 16, and extend outwardly from opposed upper side edge portions of strip 14.

With reference to FIG. 2, a second substrate strip, designated at 50, is identical with strip 10, and all reference numerals are the same with prime designations, with the exception of the end terminals tabs 52, 54, which extend outwardly from opposed lower side portions of strips 50 and are similarly copper coated, and electrically connected to first legs 16'. The terminal tabs 28, 30 of first strips 10, and 52, 54 of second strips 50, extend respectively down from the top edges of strips 10, and up from the bottom edges of strips 50 for a distance of less than one-half of the heights thereof to define a space 56 therebetween, FIG. 4.

To enhance the temperature differential between the opposed end couples 20, 22 and 20', 22', the strips 10 and 50 are alternated as illustrated in FIGS. 3 and 4. Very substantial numbers of each strip 10 and 50 are stacked together in a face-to-back relation to define a panel as indicated at 80 in FIG. 5.

All of the strips 10 are electrically interconnected in parallel at 58, 60 in FIG. 4 through termical tabs 28, 30, and the strips 50 are simularly interconnected at 62, 64 through terminal tabs 52, 54. The electrical connection of the strips 10 and 50 are both series and parallel to effect the desired voltage and current requirements.

A voltage regulator 70 is connected at 72, 74 in lead 66, and an electric water pump 76, FIG. 4, is electrically connected at 78, 79 to voltage regulator 70 to conduct the electric current through pump 76, above a substantially predetermined voltage level, to energize said pump 76 to circulate water W from any suitable source, (not shown) through a conduit 82 into an inner chamber 84 of a housing 86, secured by any suitable means to the normally cool side 88, FIG. 7, of panel 80. From inner chamber 84, the water is discharged through a conduit 90. The discharged water may be returned to its source for recirculation, or, in the use of ground water, it may be used for irrigation purposes, while providing the electricity for operation of the pump 76. The thermocouple side of panel 80 is glazed with a suitable synthetic material as at 92 to increase the efficiency of the panel and for protective purposes.

While a preferred form of the instant invention has been herein disclosed, it will be evident to those skilled in the art, that various changes and modifications can be made therein without departing from the true spirit of the invention as defined in the appended claims.

I claim:

1. A thermoelectric generator device comprising a panel composed of first and second pluralities of thermocouples, defined in respective series on face sides of alternating pluralities of substrate strips, said strips being disposed in a face-to-back relationship and including a parallel electrical connection means between said first and second pluralities; said panel including a first, hot side, and a second, cool side, as defined by the normal function of said thermocouples, and a heat exchanger means, fixed in a generally covering relation to said cool side.

2. The device as defined in claim 1 wherein said heat exchanger means comprises a housing, defining an interior chamber, normally filled with water.

3. The device as defined in claim 2 including an electrically operated pump, and control means connected between said pump and electrical connection to operate said pump, when the voltage produced by said panel is below a predetermined level, to circulate water from any suitable source through sai chamber.

4. The device as defined in claim 3 including an inlet conduit opening into said chamber, from said source, and an outlet conduit, to discharge the water from said chamber.

5. The device as defined in claim 3 wherein said control means comprises a voltage regulator.

6. The device as defined in claim 1 wherein said panel first side is sealed with a suitable synthetic glazing material.

7. The method of forming a thermoelectric generator to maintain a substantially constant predetermined voltage which comprises the steps of forming a panel having first and second pluralities of thermocouples each having hot and cool sides on alternating pluralities of substrate strips disposed in a face-to-back relation and including a parallel electrical connection between first and second pluralities, and liquid cooling means operably connected to the cool side of the panel to cool the cool side to maintain a substantially constant output.

8. The method of forming a thermoelectric generator as defined in claim 7 wherein said substantially constant voltage output is maintained by increasing the cooling of the cool side of the panel.

* * * * *